US010521539B2

(12) United States Patent
Yu et al.

(10) Patent No.: US 10,521,539 B2
(45) Date of Patent: Dec. 31, 2019

(54) OPTIMIZATION OF INTEGRATED CIRCUIT MASK DESIGN

(71) Applicants: Shenzhen Jingyuan Information Technology Limited, Shenzhen, Guangdong (CN); Dongfang Jinyuan Electron Limited, Beijing (CN)

(72) Inventors: Zongchang Yu, Guangdong (CN); Shengrui Zhang, Guangdong (CN); Weijie Shi, Guangdong (CN)

(73) Assignees: Shenzhen Jingyuan Information Technology Limited, Guangdong (CN); Dongfang Jinigryuan Electron Limited, Beijing (CN)

( * ) Notice: Subject to any disclaimer, the term of this patent is extended or adjusted under 35 U.S.C. 154(b) by 0 days.

(21) Appl. No.: 15/590,457

(22) Filed: May 9, 2017

(65) Prior Publication Data

US 2018/0225817 A1 Aug. 9, 2018

(30) Foreign Application Priority Data

Feb. 6, 2017 (CN) .......................... 2017 1 0065850

(51) Int. Cl.
*G06F 17/50* (2006.01)
*G06N 3/04* (2006.01)

(52) U.S. Cl.
CPC ........... *G06F 17/5068* (2013.01); *G06N 3/04* (2013.01)

(58) Field of Classification Search
None
See application file for complete search history.

(56) References Cited

U.S. PATENT DOCUMENTS

| | | | | |
|---|---|---|---|---|
| 8,464,194 | B1 * | 6/2013 | Agarwal | G03F 7/70433 716/112 |
| 8,739,080 | B1 * | 5/2014 | Tsai | G06F 17/5068 430/30 |
| 2008/0077907 | A1 * | 3/2008 | Kulkami | G03F 1/36 716/53 |
| 2015/0227671 | A1 * | 8/2015 | Yu | G06F 17/5081 716/52 |
| 2015/0324690 | A1 * | 11/2015 | Chilimbi | G06N 3/063 706/25 |

OTHER PUBLICATIONS

Luo, Rui. "Optical proximity correction using a multilayer perceptron neural network." Journal of Optics 15, No. 7 (2013): 075708. (Year: 2013).*

* cited by examiner

*Primary Examiner* — David Perlman
(74) *Attorney, Agent, or Firm* — Young Basile Hanlon & MacFarlane, P.C.

(57) ABSTRACT

A method, a non-transitory computer-readable medium, and an apparatus for optimizing a design layout of an integrated circuit (IC) includes: selecting layout regions from a full-chip design layout for the IC; determining pixel images for the layout regions by performing pixel-based mask optimization for the layout regions, in which each pixel image corresponds to a respective layout region; determining a backpropagation (BP) artificial neural network (ANN) model using the pixel images and the layout regions; and determining a full-chip pixel image for the full-chip design layout using the BP ANN model, in which the BP ANN model uses the full-chip design layout as input.

15 Claims, 9 Drawing Sheets

OPTIMIZATION OF INTEGRATED CIRCUIT MASK DESIGN

CROSS-REFERENCE TO RELATED APPLICATION(S)

This application claims priority to Chinese Patent Application No. 201710065850.3, filed on Feb. 6, 2017, the contents which is hereby incorporated by reference in its entirety.

TECHNICAL FIELD

This disclosure relates to manufacturing of masks of integrated circuits, and more specifically, to methods and computer-readable media for optimization of mask designs of integrated circuits.

BACKGROUND

Among manufacturing processes of modern very-large-scale integrated circuits (VLSIs), a lithography process is one of the important steps. Lithography is an important mean to transfer design patterns of an integrated circuit (IC) from a mask onto a silicon slice by a lithography machine. When the design patterns of the IC on the mask is imaged on the silicon slice via a projection objective lens of the lithography machine, light diffraction becomes more significant as characteristic sizes of the design patterns on the mask become smaller.

After rule-based optical proximity correction (OPC) and model-based optical proximity effects correction, a mask design optimization technique can be based on inversion lithography technology (ILT). The ILT aims at realizing patterns on the silicon slice (or wafer), by obtaining an ideal mask design pattern (typically as grayscale patterns or so-called pixel-based mask patterns) through complicated inversion mathematical calculations, then obtaining a final polygon-based mask design pattern through simplification and extraction operations.

Existing ILT mask optimizations can have high time cost, due to hundreds of optimization iterations and application of an OPC model to simulate a silicon wafer image for current mask optimization results for each optimization. Typically, more than 10 hours (300 CPU cores) are needed to optimize design patterns of hundreds of square microns. For a full chip (e.g., 22 mm*32 mm), it can take months and the computation load can be heavy.

SUMMARY

Disclosed herein are aspects, features, elements, and implementations of methods and systems for defect prediction of integrated circuits.

In an aspect, a method for optimizing a design layout of an integrated circuit (IC) is provided. The method includes selecting layout regions from a full-chip design layout for the IC, determining pixel images for the layout regions by performing pixel-based mask optimization for the layout regions, wherein each pixel image corresponds to a respective layout region, determining a backpropagation (BP) artificial neural network (ANN) model using the pixel images and the layout regions, and determining a full-chip pixel image for the full-chip design layout using the BP ANN model, wherein the BP ANN model uses the full-chip design layout as input.

In another aspect, a non-transitory computer-readable medium is provided. The non-transitory computer-readable medium stores a set of instructions, which when executed by a computer system using a processor become operational with the processor for optimizing a design layout of an integrated circuit (IC). The non-transitory computer-readable medium comprising instructions to select layout regions from a full-chip design layout for the IC, determine pixel images for the layout regions by performing pixel-based mask optimization for the layout regions, wherein each pixel image corresponds to a respective layout region, determine a backpropagation (BP) artificial neural network (ANN) model using the pixel images and the layout regions, and determine a full-chip pixel image for the full-chip design layout using the BP ANN model, wherein the BP ANN model uses the full-chip design layout as input.

In another aspect, an apparatus for optimizing a design layout of an integrated circuit (IC) is provided. The apparatus includes a processor and a memory coupled to the processor. The memory is configured to store a set of instructions which when executed by the processor become operational with the processor to select layout regions from a full-chip design layout for the IC, determine pixel images for the layout regions by performing pixel-based mask optimization for the layout regions, wherein each pixel image corresponds to a respective layout region, determine a backpropagation (BP) artificial neural network (ANN) model using the pixel images and the layout regions, and determine a full-chip pixel image for the full-chip design layout using the BP ANN model, wherein the BP ANN model uses the full-chip design layout as input.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

The present disclosure will be described in details with reference to the accompanying drawings and implementations, to make the objects, technical solutions, and advantages of the present disclosure more clearly understood. It should be understood that the specific implementations described herein are merely for illustration purposes and are not intended to limit the scope of this disclosure.

Figure 1:
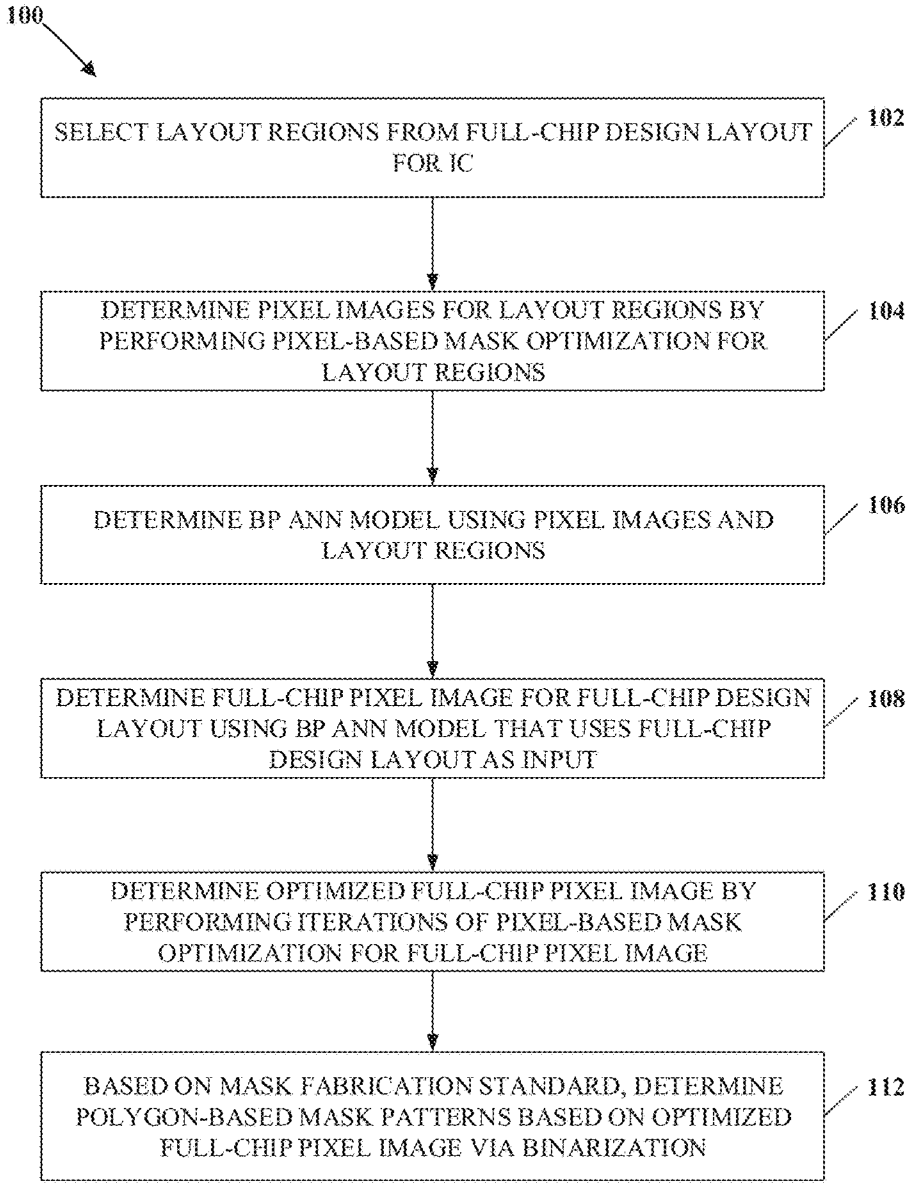
FIG. 1 is a flowchart of an example process for IC mask design optimization according to implementations of this disclosure.

Refer to FIG. 1, an example process 100 for IC mask design optimization is provided. In an implementation, the process 100 can be used for optimizing an IC mask design (e.g., a VIA layer design layout of a logic circuit on 14 nanometer (nm) node). The process 100 includes operations 102-112, which is described as follows.

At operation 102, layout regions from a full-chip design layout are selected for the IC. For example, a design layout (e.g., a full-chip design layout) for an IC can be received, and multiple design layout regions can be determined from the design layout. For example, the design layout regions can be randomly selected from the full-chip design layout. The term "receive" used herein can refer to receiving, inputting, acquiring, retrieving, obtaining, reading, accessing, or any action in any manner for inputting information or data.

Current large-scale ICs can be manufactured using lithography systems. A lithography system (or an "exposure system") includes four main parts: a lighting system (a light source), a mask, a projection system, and a wafer. Light emitted by the light source can be focused by a condenser and incident onto the mask. The light can transmit through apertures of the mask. After passing through the mask, the light can be incident on the wafer via the projection system, by which patterns on the mask (referred to as "mask patterns") can be reproduced on the wafer.

With lithography nodes advancing into 45 nm-22 nm, critical dimensions (CDs) of a circuit become much smaller than wavelengths of the light source, and interference and diffraction phenomenon of the light become more significant. This can cause distortion of the mask patterns projected onto the wafer, sometimes exceeding an acceptable range of pattern distortion. Typical effects of the distortion includes shortened lines, rounded corners, shifted CDs, etc. The optical diffraction distortion can be influenced by surrounding environment (e.g., surrounding patterns), which is referred to as "optical proximity effects" (OPE).

To solve the OPE, the design layout can be modified in advance, so that the amount of the modification can compensate for the OPE caused by the lithography system.

Therefore, by using a mask written from a design layout with OPE corrections, original design patterns can be obtained on the wafer. An iterative process of the OPE corrections is called "optical proximity correction" (OPC). The OPC can reduce impact of the OPE in the lithography process, which can substantially cut and move the design layout line by line iteratively. The final output of the OPC can be verified with actual results.

In an implementation, a design layout of an IC pattern can be received, and multiple design layout regions can be randomly extracted or selected from the design layout. For example, the design layout regions can include at least one of a representative region, a key region, a region with a known defect, and a random region.

For example, the representative pattern region can be selected from a region with higher density of design patterns. It can also be selected from a region with intermediate density of design patterns. It also can be selected from a region with lower density of design patterns.

Figure 2A:
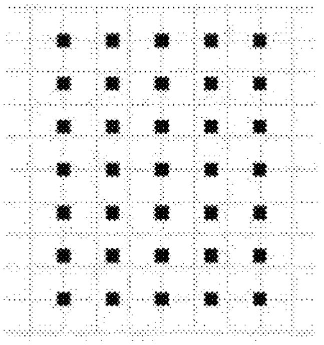
FIG. 2A is an example representative pattern for IC mask design optimization.
Figure 2B:
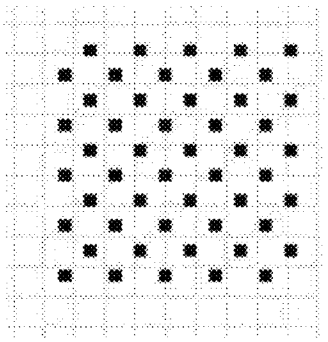
FIG. 2B is another example representative pattern for IC mask design optimization.

As shown in FIGS. 2A-2B, a standard square-hole array and an interlaced square-hole array are selected as the representative patterns, respectively. Sizes of the square holes are 76 nm×76 nm, 112 nm×112 nm, 76 nm×112 nm, and 112 nm×76 nm, respectively. Periods of X-direction and Y-direction are 165 nm, 185 nm, 205 nm, 225 nm, 245 nm, 265 nm, and 300 nm, respectively.

Figure 3A:
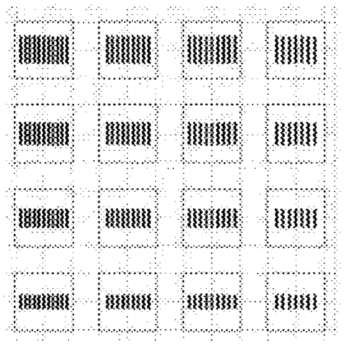
FIG. 3A is another example representative pattern for IC mask design optimization.
Figure 3B:
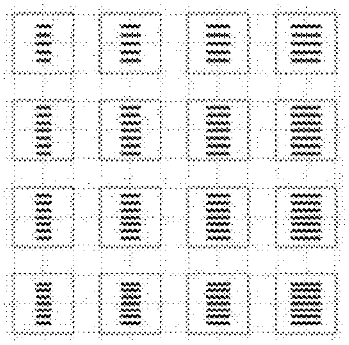
FIG. 3B is another example representative pattern for IC mask design optimization.

As shown in FIGS. 3A-3B, periodical line-and-space patterns are selected as the representative patterns. Length of short edges is 76nm, and lengths of long edges are 300 nm, 500 nm, 700 nm, 1000 nm, 1300 nm, 1500 nm, and 2000 nm, respectively. Periods are 165 nm, 185 nm, 205 nm, 225 nm, 245 nm, 265 nm, and 300 nm, respectively.

Figure 4:
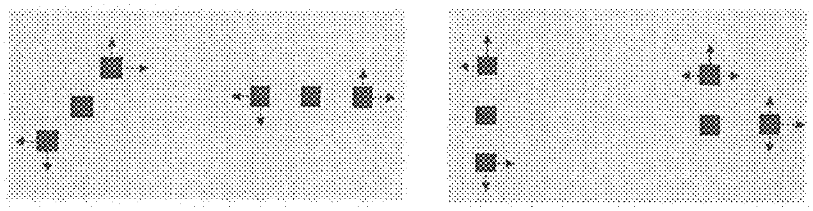
FIG. 4 is another example representative pattern for IC mask design optimization.

As shown in FIG. 4, three-square-hole arrays are selected as the representative patterns. A size of the square holes is 76 nm×76 nm, with a total of 392 square holes.

Figure 5A:
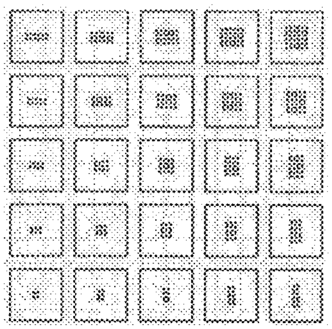
FIG. 5A is another example representative pattern for IC mask design optimization.
Figure 5B:
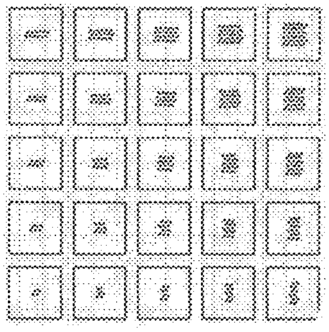
FIG. 5B is another example representative pattern for IC mask design optimization.

As shown in FIGS. 5A-5B, semi-sparse standard square-hole arrays and semi-sparse interlaced standard square-hole arrays are selected as a representative patterns, respectively. A size of the square holes is 76 nm×76 nm, internal periods are 165 nm and 255 nm, and the number of the square holes varies from 1 to 7, with a total of 1372 designs.

Referring back to FIG. 1, at operation 104, pixel images for the layout regions are determined by performing pixel-based mask optimization for the layout regions. Each pixel image can correspond to a respective layout region. For example, mask optimization (e.g., pixel-based mask optimization) is performed for design layouts of the selected design layout regions, and mask-region images (e.g., greyscale pixel images) are determined or outputted. Each of the mask-region images is associated with a mask design of a design layout region.

Figure 6A:
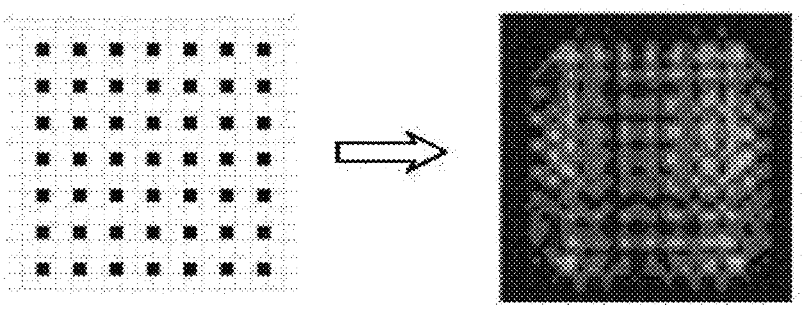
FIG. 6A is a greyscale image of an example representative pattern obtained after pixel-based mask optimization.
Figure 6B:
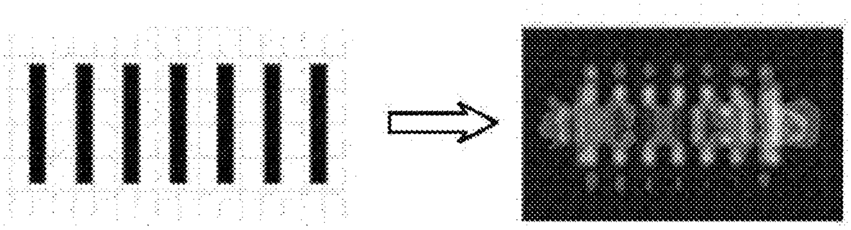
FIG. 6B is a greyscale image of another example representative pattern obtained after pixel-based mask optimization.
Figure 6C:
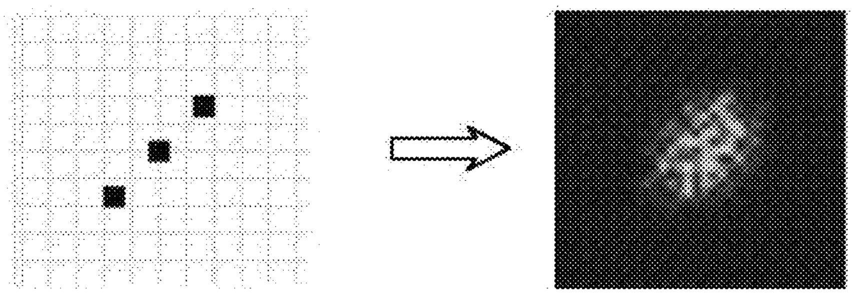
FIG. 6C is a greyscale image of another example representative pattern obtained after pixel-based mask optimization.
Figure 6D:
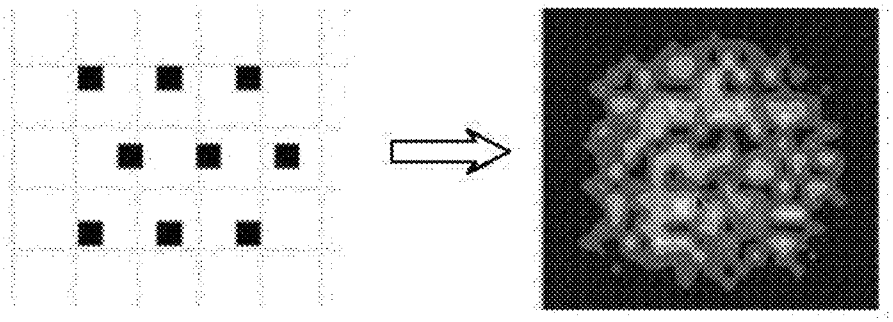
FIG. 6D is a greyscale image of another example representative pattern obtained after pixel-based mask optimization.

Methods for the pixel-based mask optimization are not limited herein. In an implementation, the pixel-based mask optimization can use edge placement errors (EPE) in an optimization function, and use a gradient descent technique for optimization. FIGS. 6A-6D show greyscale pixel images after the mask optimization (referred to as "mask-optimized greyscale pixel image") for each of the design layout regions. FIG. 6A shows the mask-optimized greyscale pixel image of a region including the standard square-hole array obtained after the pixel-based mask optimization. FIG. 6B shows the mask-optimized greyscale pixel image of a region including the periodical line-and-space patterns after the pixel-based mask optimization. FIG. 6C shows the mask-optimized greyscale pixel image of a region including a three-square-hole array after the pixel-based mask optimization. FIG. 6D shows the mask-optimized greyscale pixel image of a region including a semi-sparse interlaced standard square-hole array after the pixel-based mask optimization.

At operation 106, a backpropagation (BP) artificial neural network (ANN) model is determined using the pixel images and the layout regions. For example, the BP ANN can be determined using the mask-region images (e.g., greyscale pixel images) determined at the operation 104 and their corresponding design layout regions. In an implementation, the operation 106 can include operations S31-S40.

BP ANN, also known as backpropagation (BP) based artificial neural network (ANN), uses backpropagation of errors to train an ANN. In a propagation phase, the ANN can take inputs and the outputs are compared with expected outputs to compute error values. In a weight update phase, the error values are used to optimize and update the weights. Examples of determining the BP ANN model are described in the following description of S31-S40.

At operation S31, the BP ANN model can be determined by using design layouts corresponding to the mask-region greyscale pixel images determined at the operation 104 as inputs (e.g., input vectors), and using the mask-region greyscale pixel images as expected outputs (e.g., output vectors).

Figure 7:
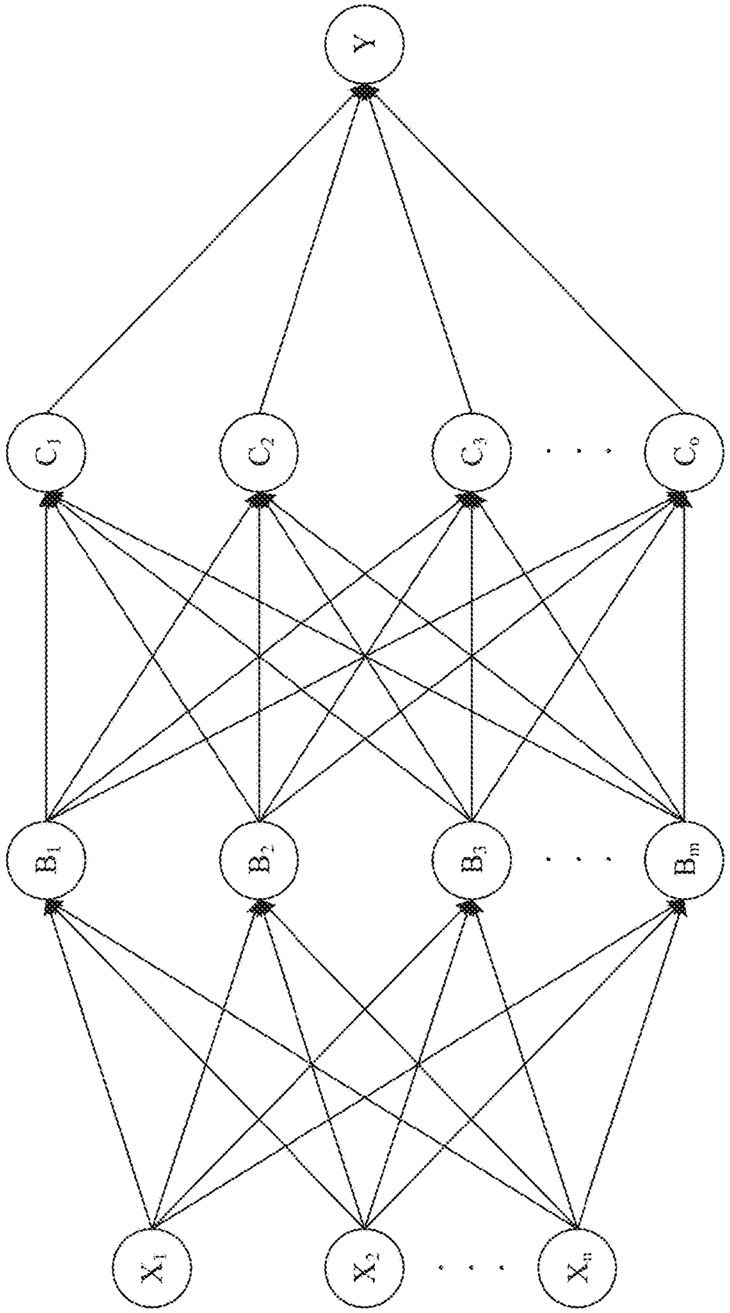
FIG. 7 is a diagram of an example BP ANN model for IC mask design optimization according to implementations of this disclosure.
Figure 8A:
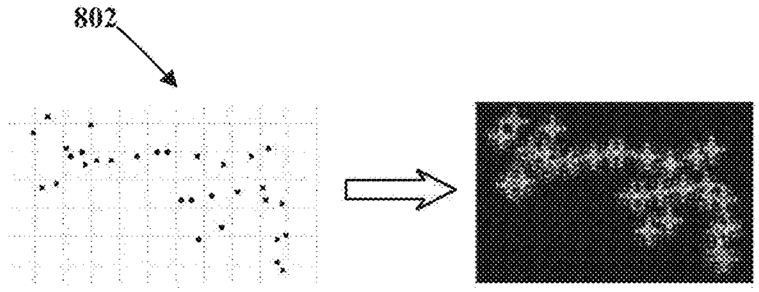
FIG. 8A is a greyscale mask image of an example representative pattern optimized by a BP ANN model.
Figure 8B:
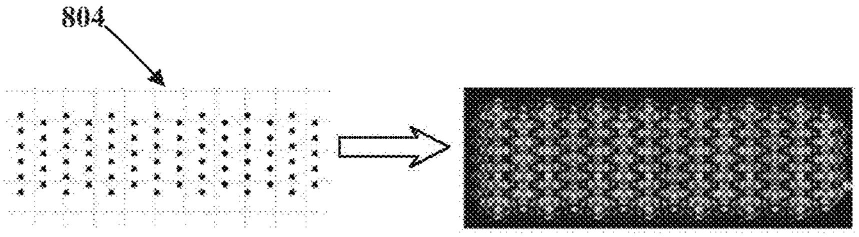
FIG. 8B is a greyscale mask image of another example representative pattern optimized by a BP ANN model.
Figure 8C:
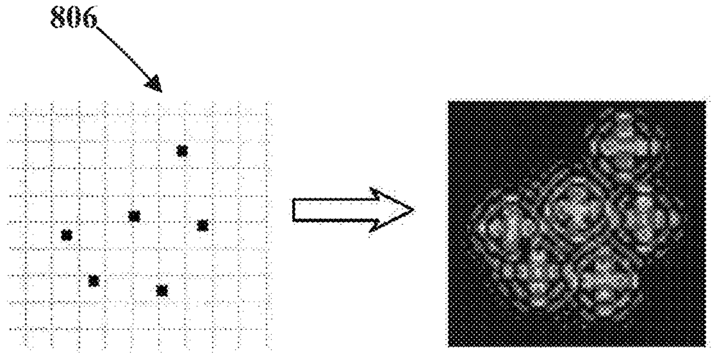
FIG. 8C is a greyscale mask image of another example representative pattern optimized by a BP ANN model.
Figure 8D:
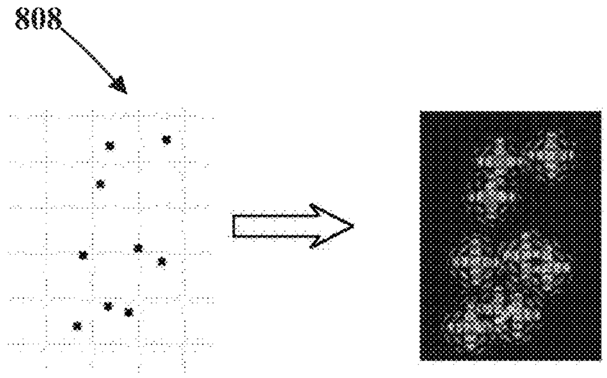
FIG. 8D is a greyscale mask image of another example representative pattern optimized by a BP ANN model.

Refer to FIG. 7, an example BP ANN model can include an input layer, at least one hidden layer, and an output layer. Network structures of the BP ANN can be as follows. The input layer has n neurons, the hidden layer hasp neurons, and the output layer has q neurons. In an implementation, the input layer includes 40*40 nodes, the at least one hidden layer includes two hidden layers, and the output layer includes one or more nodes. In an example as shown in FIG. 7, the output layer includes one node.

The variables of the BP ANN are described as follows. It should be noted that the following vector implementation of the variables are only examples. This disclosure can include other implementations for the BP ANN variables.

Input vector: $x=(x_1, x_2, \ldots, x_n)$.

In an implementation, the input vector can include region design layouts of a full chip corresponding to the mask-region greyscale pixel images determined for the design layout regions obtained at the operation 102, with n=1600.

Input vector of the hidden layer: $hi=(hi_1, hi_2, \ldots, hi_p)$.

Output vector of the hidden layer: $ho=(ho_1, ho_2, \ldots, ho_p)$.

Input vector of the output layer: $yi=(yi_1, yi_2, \ldots, yi_q)$.

Output vector of the output layer: $yo=(yo_1, yo_2, \ldots, yo_q)$.

In the above implementation, the output vector can include a network-outputted greyscale image for the mask design (referred to as a "greyscale mask-design image") corresponding to design layouts of the design layout regions.

Expected output vector: $d_o=(d_1, d_2, \ldots, d_q)$.

In the above implementation, the expected output vector can include the mask-region greyscale pixel images obtained at the operation 106.

Connection weight between the input layer and the hidden layer: $w_{ih}$.

Connection weight between the hidden layer and the output layer: $w_{ho}$.

Threshold for each neuron of the hidden layer: $b_h$.

Threshold for each neuron of the output layer: $b_0$.

Quantity of sample data: k=1, 2, . . . , m.

Activation function: $f(*)$.

Error function: $E=\frac{1}{2}\sum_{o=1}^{q}(d_o(k)-yo_o(k))^2$.

The error function can be indicative of a difference between the mask-region greyscale pixel images obtained at the operation 106 and the network-outputted greyscale mask-design image corresponding to the design layouts of the design layout regions.

At operation S32, the BP ANN is initialized. In an implementation, each of the connection weights can be assigned with a random weight in a range (−1, 1). The error function E can be set. A computation accuracy value c and a maximum number of learning times M can be set.

At operation S33, the k-th sample data and its corresponding expected output are randomly selected as follows:

$$x(k)=(x_1(k), x_2(k), \ldots, x_n(k))$$

$$d_o(k)=(d_1(k), d_2(k), \ldots, d_q(k))$$

At operation S34, inputs and outputs for each of the hidden layer neurons are computed as follows:

$$hi_h(k)=\sum_{i=1}^{n} w_{ih}x_i(k)-b_h,\ h=1, 2, \ldots, p$$

$$ho_h(k)=f(hi_h(k)),\ h=1, 2, \ldots, p$$

$$yi_o(k)=\sum_{h=1}^{p} w_{ho}ho_h(k)-b_o,\ o=1, 2, \ldots, q$$

$$yo_o(k)=f(yi_o(k)),\ o=1, 2, \ldots, q$$

At operation S35, a partial derivative of the error function with respect to each of the output layer neurons $\delta_o$ (k) is computed using the expected outputs and actual outputs.

$$\begin{cases} \dfrac{\partial E}{\partial w_{ho}} = \dfrac{\partial E}{\partial yi_o}\dfrac{\partial yi_0}{\partial w_{ho}} \\ \dfrac{\partial yi_o(k)}{\partial w_{ho}} = \dfrac{\partial\left(\sum_{h}^{p} w_{ho}ho_h(k) - b_o\right)}{\partial w_{ho}} = ho_h(k) \\ \dfrac{\partial E}{\partial yi_o} = \dfrac{\partial\left(\frac{1}{2}\sum_{o=1}^{q} (d_o(k) - yo_o(k))^2\right)}{\partial yi_0} \\ \quad = -(d_o(k) - yo_o(k))yo_o'(k) \\ \quad = -(d_o(k) - yo_o(k)f'(yi_o(k))) \triangleq -\delta_o(k) \end{cases}$$

At operation S36, a partial derivative of the error function with respect to each of the hidden layer neurons $\delta_h$(k) is computed using the connection weights between the hidden layer and the output layer, $\delta_o$(k) of the output layer, and outputs of the hidden layer.

$$\begin{cases} \dfrac{\partial E}{\partial w_{ho}} = \dfrac{\partial E}{\partial yi_o}\dfrac{\partial yi_0}{\partial w_{ho}} = -\delta_0(k)ho_h(k) \\ \dfrac{\partial E}{\partial w_{ih}} = \dfrac{\partial E}{\partial hi_h(k)}\dfrac{\partial hi_h(k)}{\partial w_{ih}} \\ \dfrac{\partial hi_h(k)}{\partial w_{ih}} = \dfrac{\partial\left(\sum_{i=1}^{n} w_{ih}x_i(k) - b_h\right)}{\partial w_{ih}} = x_i(k) \\ \dfrac{\partial E}{\partial hi_h(k)} = \dfrac{\partial\left(\frac{1}{2}\sum_{o=1}^{q} (d_o(k) - yo_o(k))^2\right)}{\partial ho_h(k)}\dfrac{\partial ho_h(k)}{\partial hi_h(k)} \\ \quad = \dfrac{\partial\left(\frac{1}{2}\sum_{o=1}^{q} (d_o(k) - f(yi_o(k)))^2\right)}{\partial ho_h(k)}\dfrac{\partial ho_h(k)}{\partial hi_h(k)} \\ \quad = \dfrac{\partial\left(\frac{1}{2}\sum_{o=1}^{q} \left(d_o(k) - f\left(\sum_{h=1}^{p} w_{ho}ho_h(k) - b_o\right)\right)^2\right)}{\partial ho_h(k)}\dfrac{\partial ho_h(k)}{\partial hi_h(k)} \\ \quad = -\sum_{o=1}^{q} (d_o(k) - y_o(k))f'(yi_o(k))w_{ho}\dfrac{\partial ho_h(k)}{\partial hi_h(k)} \\ \quad = -\left(\sum_{o=1}^{q} \delta_o(k)w_{ho}\right)f'(hi_h(k)) \triangleq -\delta_h(k) \end{cases}$$

At operation S37, the weights $w_{ho}(k)$ for the output layer can be updated using the partial derivative $\delta_o(k)$ of the output layer neurons and output of the hidden layer neurons:

$$\Delta w_{ho}(k) = -\mu\frac{\partial E}{\partial w_{ho}}\mu\delta_o(k)ho_h(k)$$

$$w_{ho}^{N+1} = w_{ho}^{N} + \eta\delta_o(k)ho_h(k)$$

At operation S38, the connection weights $w_{ih}(k)$ can be corrected using the partial derivative $\delta_h(k)$ for each of the hidden layer neurons and inputs of each of the input layer neurons. For example, the connection weights $w_{ih}(k)$ can be updated as follows using the step values $\mu$ and $\eta$:

$$\Delta w_{ih}(k) = -\mu\frac{\partial E}{\partial w_{ih}} = -\mu\frac{\partial E}{\partial hi_h(k)}\frac{\partial hi_h(k)}{\partial w_{ih}} = \delta_h(k)x_i(k)$$

$$w_{ih}^{N+1} = w_{ih}^{N} + \eta\delta_h(k)x_i(k)$$

At operation S39, the error function E is computed.

$$E = \frac{1}{2m}\sum_{k=1}^{m}\sum_{o=1}^{q}(d_o(k) - y_o(k))^2$$

At operation S40, it is determined whether the value of the error function E meets a requirement. When the value of the error function E reaches a preset accuracy or the number of learning times is greater than a set maximum number, the process can be terminated and applied to the greyscale mask-design image. Otherwise, a next sample for learning and its corresponding expected outputs can be selected, and the process can return to the operation S34 for a next-round learning, until the error function E reaches the preset accuracy or the number of learning times is greater than the set maximum number.

The BP ANN model can optimize inputted design layouts, in which the design layouts can be optimized to generate a grayscale image applicable to a mask design (a "greyscale mask-design image"), and output the greyscale mask-design image.

Referring back to FIG. 1, at operation 108, a full-chip pixel image is determined for the full-chip design layout using the BP ANN model. The BP ANN model can use the full-chip design layout as input. For example, the full-chip design layout is inputted to the BP ANN model determined at the operation 106, and a greyscale mask-design image for the full-chip design layout is determined.

At operation 110, an optimized full-chip pixel image is determined by performing iterations of the pixel-based mask optimization for the full-chip pixel image. For example, the greyscale mask-design image for the full-chip design layout determined at the operation 108 can be fine-tuned (e.g., by performing iterations of the pixel-based mask optimization), and a fine-tuned greyscale mask-design image for the full-chip design layout can be determined.

At operation 112, based on a mask fabrication standard, polygon-based mask patterns are determined based on the optimized full-chip pixel image via binarization. The binarization process can change a greyscale image into a binary image (e.g., black and white). The obtained polygon-based mask patterns can be directly used for fabrication. When necessary, further optimization based on polygons can be performed to the determined polygon-based mask patterns.

Referring to FIGS. 8A-8D, four regions of 1.5 mm×1.5 mm (labeled as region 802, region 804, region 806, and region 808) can be selected (e.g., randomly selected) from the greyscale mask-design image for the full-chip design layout determined at the operation 108. Greyscale mask-design images corresponding to the regions 802-808 can be shown in FIGS. 8A-8D.

In an implementation, a comparison based on experiments can be shown as follows.

The four regions of 1.5 mm×1.5 mm (the regions 802-808) are randomly selected from the greyscale mask-design image for the full-chip design layout determined at the operation 108. The four regions can be fine-tuned via pixel-based mask optimization (e.g., iterating the optimization for 17 times) to determine the fine-tuned greyscale mask-design images of the four regions for performing a lithography performance test.

In an implementation, the regions 802-808 can be extracted from a region the same with the design layout at the operation 102. The four regions can be fine-tuned via pixel-based mask optimization (e.g., iteratively optimizing for 50 times) to obtained fine-tuned greyscale mask-design images for the four regions for lithography performance test. Table 1 shows comparison between lithography performance test results obtained from BP ANN based optimization and pixel-based mask image optimization.

TABLE 1

| PV-Band (Average) | Region 802 | Region 804 | Region 806 | Region 808 |
|---|---|---|---|---|
| Pixel-based Greyscale Mask Optimization (50 Iterations) | 2.93 nm | 2.39 nm | 2.38 nm | 2.26 nm |
| ANN + 17 Optimization Iterations | 3.06 nm | 2.44 nm | 2.27 nm | 2.15 nm |

In this implementation, the lithography performance is measured in process variation bands (referred to as "PV-Bands"). The PV-Bands can be calculated as:

PV−band=max(EPE@PW_conditions)−min (EPE@PW_conditions)

In the above equation, EPE represents a position difference between a profile on the wafer and target design patterns, PW_conditions is an exposure condition of the lithography process. In this implementation, as an example, defocus can be adopted (e.g., at ±40 nm), and exposure dose error can be ±3%.

It can be seen from Table 1 that the BP ANN based greyscale mask image optimization according to this disclosure can achieve the same level of optimization accuracy as the pixel-based mask image optimization. In addition, the iteration times can be reduced from 50 to 17, which increases the optimization speed by about 65%.

Figure 9:
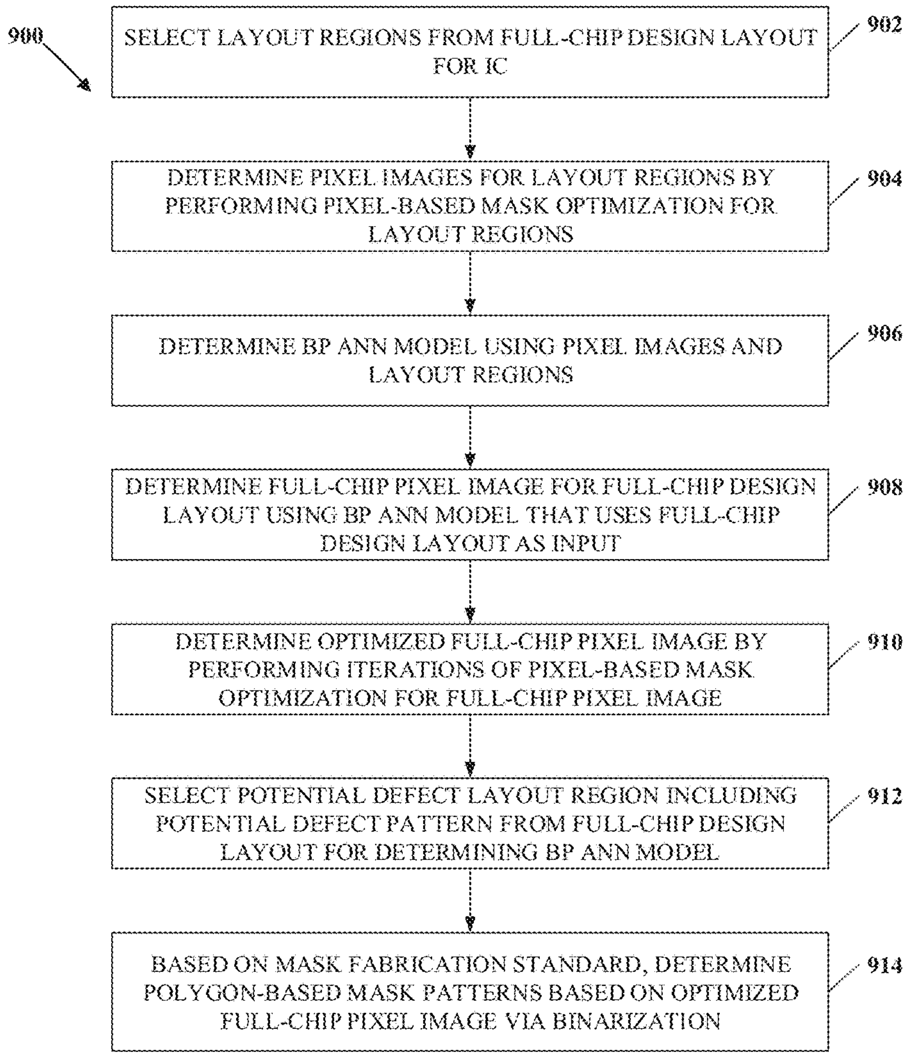
FIG. 9 is a flowchart of another example process for IC mask design optimization according to implementations of this disclosure.

Referring to FIG. 9, another implementation is provided according to this disclosure. The implementation as shown in FIG. 9 is different from the implementation as shown in FIG. 1 as follows. Operations 902-910 of a process 900 are similar to the operations 102-110. Operation 914 is similar to the operation 112. An additional operation 912 is included in the process 900.

At the operation 912, a potential defect layout region is selected from the full-chip design layout for determining the BP ANN model, in which the potential defect layout region comprises a potential defect pattern. For example, layout regions including potential defect patterns emerging from the operation 910 can be added into the representative design layout regions at the operation 102, and further used as training samples for the BP ANN model at the operation 106.

For example, to further improve capability of greyscale mask image optimization for the BP ANN in FIG. 1, potential defect regions in the full chip can be added into the representative design layout regions at the operation 902, and further used as training samples for the BP ANN model at the operation 906.

The potential defect patterns can include at least one of: defect patterns determined based on previous experience, defect patterns found at the operation 908 after performing the BP ANN model based optimization for the design layout regions, defect patterns found at the operation 910 after the fine tuning, and/or defect patterns found at the operation 910 after successive mask polygon conversion (e.g., determining the polygon-based mask patterns) followed by mask verification. The defect patterns can be fed back (e.g., added) into the representative design layout regions at the operation 902 to repeat the BP ANN model based optimization at the operations 904-906, forming a closed loop optimization process. The entire process can be iteratively optimized according to needs.

For example, a defect can include patterns at a certain point with a PV-band greater than 5 nm. The mask verification can be performed after the operation 908 in FIG. 9. Two regions (region a and region b) can be randomly selected from the full-chip design layout. Numbers of defect patterns in the region a and the region b can be detected, and the number of detected defect patterns can be recorded.

In the above example, the defect patterns detected at the operation 908 can be added into the representative design layout regions at the operation 902. The operations 904-906 can be repeated. The number of defect patterns in the region a and the region b can be re-detected re-recorded, and compared with previous detecting results. The compare results are shown in Table 2.

TABLE 2

| Number of defects | Region a | Region b |
|---|---|---|
| First detection | 884 | 1333 |
| Optimized detection with defect sets | 149 | 1194 |

It can be seen from Table 2 that, by adding the defect patterns into the representative design layout regions at the operation 902 and use them as the training samples for the BP ANN model, design defect patterns in the full- chip design layout can be effectively reduced, time for mask optimization by the BP ANN can be reduced, and optimization capability of the BP ANN can be increased.

A non-transitory computer-readable storage medium is also provided according to this disclosure. The non-transitory computer-readable medium can store a set of instructions, which when executed by a computer system using a processor become operational with the processor for optimizing a design layout of an integrated circuit (IC). The non-transitory computer-readable medium comprising instructions to perform the following operations S1-S6.

At operation S1, layout regions from a full-chip design layout are selected for the IC. For example, a full-chip design layout for an IC is received, and design layout regions are selected (e.g., randomly selected) from the full-chip design layout.

At operation S2, pixel images for the layout regions are determined by performing pixel-based mask optimization for the layout regions. Each pixel image can correspond to a respective layout region. For example, pixel-based mask optimization is performed for the selected design layout regions, and mask-region greyscale pixel images are outputted or determined. Each of the mask-region greyscale pixel images is associated with a mask design of a respective design layout region.

At operation S3, a BP ANN model is determined using the pixel images and the layout regions. For example, the BP ANN can be determined using the mask-region greyscale pixel images determined at the operation S2 and their corresponding design layout regions.

At operation S4, a full-chip pixel image is determined for the full-chip design layout using the BP ANN model. The BP ANN model can use the full-chip design layout as input. For example, the full-chip design layout is inputted into the BP ANN model determined at the operation S3, and a greyscale mask-design image for the full-chip design layout is determined.

In some implementations, optionally, at operation S5, an optimized full-chip pixel image is determined by performing iterations of the pixel-based mask optimization for the full-chip pixel image. For example, the pixel-based mask optimization can be performed to fine tune the greyscale mask-design image for the full-chip design layout determined at the operation S4, and a fine-tuned greyscale mask-design image for the full-chip design layout can be determined.

In some implementations, optionally, at operation S6, based on a mask fabrication standard, polygon-based mask patterns are determined based on the optimized full-chip pixel image via binarization. The polygon-based mask patterns can be directly used for fabrication. For example, based on the mask fabrication standard, the greyscale mask-design image for the full-chip design layout determined at the operation S5 can be binarized to extract polygons. When necessary, further optimization based on polygons can be performed to the determined polygon-based mask patterns.

The design layout regions in the operation S1 can include at least one of: representative pattern regions, key pattern regions, known defected layouts regions, and random pattern regions.

An apparatus for optimizing a design layout of an integrated circuit (IC) is also provided according to this disclosure. The apparatus includes a processor and a memory coupled to the processor. The processor can be any type of device, or multiple devices, capable of manipulating or processing information. The processor can include a central processor (e.g., a central processing unit or CPU). The processor can also include a graphics processor (e.g., a graphics processing unit or GPU). Although the examples herein can be practiced with a single processor as shown, advantages in speed and efficiency can be achieved using more than one processor. The processor can be distributed across multiple machines or devices (each machine or device having one or more processors) that can be coupled directly or across a local area or other network. The memory herein can be any device, or multiple devices, capable of storing codes and data that can be accessed by the processor (e.g., via a bus). For example, the memory herein can be a random access memory device (RAM), a read-only memory device (ROM), an optical/magnetic disc, a hard drive, a solid state drive, a flash drive, a security digital (SD) card, a memory stick, a compact flash (CF) card, or any combination of any suitable type of storage device. The codes can include an operating system (OS) and one or more application programs (e.g., apps) processing and/or outputting the data. The memory herein can be distributed across multiple machines or devices, such as a network-based memory or cloud-based memory.

The memory of the apparatus can be configured to store a set of instructions. In an implementation, when executed by the processor, the instructions can become operational with the processor to: select layout regions from a full-chip design layout for the IC; determine pixel images for the layout regions by performing pixel-based mask optimization for the layout regions, in which each pixel image corresponds to a respective layout region; determine a backpropagation (BP) artificial neural network (ANN) model using the pixel images and the layout regions; and determine a full-chip pixel image for the full-chip design layout using the BP ANN model, wherein the BP ANN model uses the full-chip design layout as input.

Compared with existing techniques, the following benefits can be obtained according to this disclosure.

By optimizing the greyscale mask images using the BP ANN to obtain optimized greyscale mask images, speed for optimizing the greyscale mask images can be increased, capability of optimizing the full-chip greyscale mask image can be improved, rapid mask optimization can be realized, and simpler process can be achieved.

By adding the potential defect patterns into the representative design layout regions to form close-loop system-wise adjustment, design defect patterns in the full-chip design layout can be further reduced, and time for mask optimization can be reduced.

As described above, it should be noted that, all or a portion of aspects of the disclosure described herein can be implemented using a general purpose computer/processor with a computer program that, when executed, carries out any of the respective techniques, algorithms and/or instructions described herein. In addition, or alternatively, for example, a special purpose computer/processor can be utilized which can contain specialized hardware for carrying out any of the techniques, algorithms, or instructions described herein.

The implementations of computing devices as described herein (and the algorithms, methods, instructions, etc., stored thereon and/or executed thereby) can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors or any other suitable circuit. In the claims, the term "processor" should be understood as encompassing any of the foregoing, either singly or in combination. The terms "signal" and "data" are used interchangeably. Further, portions of the computing devices do not necessarily have to be implemented in the same manner The aspects herein can be described in terms of functional block components and various processing operations. The disclosed processes and sequences may be performed alone or in any combination. Functional blocks can be realized by any number of hardware and/or software components that perform the specified functions. For example, the described aspects can employ various integrated circuit components, e.g., memory elements, processing elements, logic elements, look-up tables, and the like, which can carry out a variety of functions under the control of one or more microprocessors or other control devices. Similarly, where the elements of the described aspects are implemented using software programming or software elements the disclosure can be implemented with any programming or scripting language such as C, C++, Java, assembler, or the like, with the various algorithms being implemented with any combination of data structures, objects, processes, routines or other programming elements. Functional aspects can be implemented in algorithms that execute on one or more processors. Furthermore, the aspects of the disclosure could employ any number of conventional techniques for electronics configuration, signal processing and/or control, data processing and the like. The words "mechanism" and "element" are used broadly and are not limited to mechanical or physical implementations or aspects, but can include software routines in conjunction with processors, etc.

Implementations or portions of implementations of the above disclosure can take the form of a computer program product accessible from, for example, a computer-usable or computer-readable medium. A computer-usable or computer-readable medium can be any device that can, for example, tangibly contain, store, communicate, or transport a program or data structure for use by or in connection with any processor. The medium can be, for example, an electronic, magnetic, optical, electromagnetic, or a semiconductor device, such as a hard disc drive, a memory device, a solid state drive, a flash drive, or an optical drive. Other suitable mediums are also available. Such computer-usable or computer-readable media can be referred to as non-transitory memory or media. A memory of an apparatus described herein, unless otherwise specified, does not have to be physically contained by the apparatus, but is one that can be accessed remotely by the apparatus, and does not have to be contiguous with other memory that might be physically contained by the apparatus.

Any of the individual or combined functions described herein as being performed as examples of the disclosure can be implemented using machine readable instructions in the form of code for operation of any or any combination of the aforementioned computational hardware. Computational code can be implemented in the form of one or more modules by which individual or combined functions can be performed as a computational tool, the input and output data of each module being passed to/from one or more further module during operation of the methods and systems described herein.

Information, data, and signals can be represented using a variety of different technologies and techniques. For example, any data, instructions, commands, information, signals, bits, symbols, and chips referenced herein can be represented by voltages, currents, electromagnetic waves, magnetic fields or particles, optical fields or particles, other items, or a combination of the foregoing.

The particular aspects shown and described herein are illustrative examples of the disclosure and are not intended to otherwise limit the scope of the disclosure in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. Many alternative or additional functional relationships, physical connections or logical connections may be present in a practical device.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. In other words, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an aspect" or "one aspect" throughout is not intended to mean the same implementation or aspect unless described as such.

The use of "including" or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The use of the terms "a" and "an" and "the" and similar referents in the context of describing the disclosure (especially in the context of the following claims) should be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein are performable in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed.

It should be understood that although this disclosure uses terms such as first, second, third, etc., the disclosure should not be limited to these terms. These terms are used only to distinguish similar types of information from each other. For example, without departing from the scope of this disclosure, a first information can also be referred to as a second information; and similarly, a second information can also be referred to as a first information. Depending on the context, the words "if" as used herein can be interpreted as "when," "while," or "in response to."

While the disclosure has been described in connection with certain implementations, it is to be understood that the disclosure is not to be limited to the disclosed implementations but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for optimizing a design layout of an integrated circuit (IC), comprising:

selecting layout regions from a full-chip design layout for the IC;

determining pixel images for the layout regions by performing pixel-based mask optimization for the layout regions, wherein each pixel image corresponds to a respective layout region;

determining a backpropagation (BP) artificial neural network (ANN) model using the pixel images as training outputs of the BP ANN and the layout regions from the full-chip design layout for the IC as training inputs of the BP ANN;

determining a full-chip pixel image for the full-chip design layout using the BP ANN model, wherein the BP ANN model uses the full-chip design layout as input and outputs a greyscale mask-design image;

determining an optimized full-chip pixel image by performing iterations of the pixel-based mask optimization on the full-chip pixel image, wherein the optimized full-chip pixel image is a greyscale image;

determining polygons from the optimized full-chip pixel image by converting the optimized full-chip pixel image into a binary image via binarization; and determining, based on a mask fabrication standard, polygon-based mask patterns using the polygons, wherein the polygon-based mask patterns are for fabrication.

2. The method of claim 1, wherein the layout regions comprise at least one of a representative layout region, a key layout region, a known defected layout region, and a random layout region.

3. The method of claim 2, wherein the representative layout region comprises at least one of: a standard square-hole pattern, an interlaced square-hole pattern, a periodical line-and-space pattern, a three-square-hole pattern, and a potential defect.

4. The method of claim 1, wherein selecting the layout regions from the full-chip design layout for the IC comprises:

selecting the layout regions in a random manner from at least one of: representative layout regions of the full-chip design layout, key layout regions of the full-chip design layout, known defected layout regions of the full-chip design layout, and random layout regions of the full-chip design layout.

5. The method of claim 1, further comprising:

determining a potential defect pattern from at least one of: a known defect pattern, a first defect pattern determined from the full-chip pixel image, a second defect pattern determined from the optimized full-chip pixel image, and a third defect pattern determined from the polygon-based mask patterns after mask verification.

6. The method of claim 5, further comprising:

selecting a potential defect layout region from the full-chip design layout for determining the BP ANN model, wherein the potential defect layout region comprises the potential defect pattern.

7. The method of claim 1, wherein determining the polygon-based mask patterns using the polygons determined from the optimized full-chip pixel image by binarization comprises:

determining the polygon-based mask patterns using additional optimization based on the polygons.

8. The method of claim 1, wherein determining the BP ANN model using the pixel images and the layout regions comprises:

determining a current output image by the BP ANN model using a current layout region of the layout regions as input, wherein the BP ANN model comprises weights associated with at least one of an input layer, an output layer, and at least one hidden layer;

determining whether a match exists between the current output image and an expected pixel image of the pixel images associated with the current layout region; and updating the weights based on a determination that the match does not exist.

9. A non-transitory computer-readable medium storing a set of instructions which when executed by a computer system using a processor become operational with the processor for optimizing a design layout of an integrated circuit (IC), the non-transitory computer-readable medium comprising instructions to:

select layout regions from a full-chip design layout for the IC;

determine pixel images for the layout regions by performing pixel-based mask optimization for the layout regions, wherein each pixel image corresponds to a respective layout region;

determine a backpropagation (BP) artificial neural network (ANN) model using the pixel images as training outputs of the BP ANN and the layout regions from the full-chip design layout for the IC as training inputs of the BP ANN;

determine a full-chip pixel image for the full-chip design layout using the BP ANN model, wherein the BP ANN model uses the full-chip design layout as input and outputs a greyscale mask-design image;

determine an optimized full-chip pixel image by performing iterations of the pixel-based mask optimization for the full-chip pixel image, wherein the optimized full-chip pixel image is a greyscale image; and determine, based on a mask fabrication standard, polygon-based mask patterns using polygons determined from the optimized full-chip pixel image by binarization, wherein the polygon-based mask patterns are for fabrication, wherein the binarization comprises converting the optimized full-chip pixel image into a binary image.

10. The non-transitory computer-readable medium of claim 9, wherein the instructions to select the layout regions from the full-chip design layout for the IC further comprise instructions to:

select the layout regions in a random manner from at least one of: representative layout regions of the full-chip design layout, key layout regions of the full-chip design layout, known defected layout regions of the full-chip design layout, and random layout regions of the full-chip design layout.

11. The non-transitory computer-readable medium of claim 9, further comprising instructions to:

determine a potential defect pattern from at least one of: a known defect pattern, a first defect pattern determined from the full-chip pixel image, a second defect pattern determined from the optimized full-chip pixel image, and a third defect pattern determined from the polygon-based mask patterns after mask verification.

12. The non-transitory computer-readable medium of claim 11, further comprising instructions to:

select a potential defect layout region from the full-chip design layout for determining the BP ANN model, wherein the potential defect layout region comprises the potential defect pattern.

13. The non-transitory computer-readable medium of claim 9, wherein the instructions to determine the BP ANN model using the pixel images and the layout regions further comprise instructions to:

determine a current output image by the BP ANN model using a current layout region of the layout regions as input, wherein the BP ANN model comprises weights associated with at least one of an input layer, an output layer, and at least one hidden layer;

determine whether a match exists between the current output image and an expected pixel image of the pixel images associated with the current layout region; and update the weights based on a determination that the match does not exist.

14. An apparatus for optimizing a design layout of an integrated circuit (IC), comprising:

a processor; and a memory coupled to the processor, the memory configured to store a set of instructions which when executed by the processor become operational with the processor to:

select layout regions from a full-chip design layout for the IC;

determine pixel images for the layout regions by performing pixel-based mask optimization for the layout regions, wherein each pixel image corresponds to a respective layout region;

determine a backpropagation (BP) artificial neural network (ANN) model using the pixel images as training outputs of the BP ANN and the layout regions from the full-chip design layout for the IC as training inputs of the BP ANN;

determine a full-chip pixel image for the full-chip design layout using the BP ANN model, wherein the BP ANN model uses the full-chip design layout as input and outputs a greyscale mask-design image;

determine an optimized full-chip pixel image by performing iterations of the pixel-based mask optimization for the full-chip pixel image, wherein the optimized full-chip pixel image is a greyscale image; and based on a mask fabrication standard, determine polygon-based mask patterns using polygons determined from the optimized full-chip pixel image by binarizing the optimized full-chip pixel image into a binary image, wherein the polygon-based mask patterns are for fabrication.

15. The apparatus of claim 14, wherein the memory further comprises instructions when executed by the processor become operational with the processor to:

determine a potential defect pattern from at least one of: a known defect pattern, a first defect pattern determined from the full-chip pixel image, a second defect pattern determined from the optimized full-chip pixel image, and a third defect pattern determined from the polygon-based mask patterns after mask verification; and select a potential defect layout region from the full-chip design layout for determining the BP ANN model, wherein the potential defect layout region comprises the potential defect pattern.

* * * * *